(12) United States Patent
Lin et al.

(10) Patent No.: US 12,261,026 B2
(45) Date of Patent: Mar. 25, 2025

(54) METHOD AND APPARATUS FOR REVITALIZING PLASMA PROCESSING TOOLS

(71) Applicant: TAIWAN SEMICONDUCTOR MANUFACTURING CO., LTD., Hsinchu (TW)

(72) Inventors: Chi-Hsing Lin, Hsinchu (TW); Chen-Fon Chang, Hsinchu (TW); Chun-Yi Wu, Hsinchu (TW); Shi-Yu Ke, Hsinchu (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1030 days.

(21) Appl. No.: 17/219,181

(22) Filed: Mar. 31, 2021

(65) Prior Publication Data
US 2022/0319814 A1   Oct. 6, 2022

(51) Int. Cl.
*H01J 37/32* (2006.01)
*C23C 16/52* (2006.01)
*H01L 21/66* (2006.01)
*H01L 21/67* (2006.01)

(52) U.S. Cl.
CPC ........ *H01J 37/32477* (2013.01); *C23C 16/52* (2013.01); *H01J 37/32972* (2013.01); *H01L 21/67069* (2013.01); *H01L 21/67253* (2013.01); *H01L 22/20* (2013.01); *H01J 2237/0225* (2013.01); *H01J 2237/2007* (2013.01); *H01J 2237/2445* (2013.01); *H01J 2237/24585* (2013.01); *H01J 2237/332* (2013.01); *H01J 2237/334* (2013.01)

(58) Field of Classification Search
CPC .......... H01J 37/32477; H01J 37/32972; H01J 2237/0225; H01J 2237/24585; H01J 2237/332; H01J 2237/334; H01J 2237/2007; H01J 2237/2445; H01L 21/67069; H01L 21/67253; H01L 22/20; C23C 16/52
See application file for complete search history.

(56) References Cited

U.S. PATENT DOCUMENTS

2013/0288037 A1* 10/2013 Sun .................. C04B 35/505
                                                    428/312.8
2015/0126036 A1    5/2015 Zhao

OTHER PUBLICATIONS

Machine Translation of EP17185230B1 (Year: 2010).*
Machine Translation of KR101752782B1 (Year: 2017).*

* cited by examiner

*Primary Examiner* — Sharidan Carrillo
(74) *Attorney, Agent, or Firm* — STUDEBAKER BRACKETT PLLC

(57) ABSTRACT

Methods for revitalizing components of a plasma processing apparatus that includes a sensor for detecting a thickness or roughness of a peeling weakness layer on a protective surface coating of a plasma processing tool and/or for detecting airborne contaminants generated by such peeling weakness layer. The method includes detecting detrimental amounts of peeling weakness layer buildup or airborne concentration of atoms or molecules from the peeling weakness layer, and initiating a revitalization process that bead beats the peeling weakness layer to remove it from the component while maintaining the integrity of the protective surface coating.

20 Claims, 12 Drawing Sheets

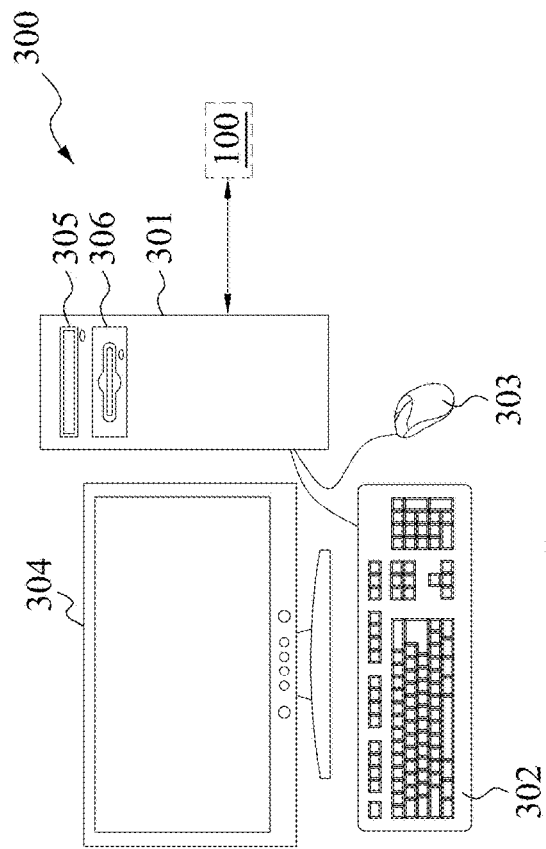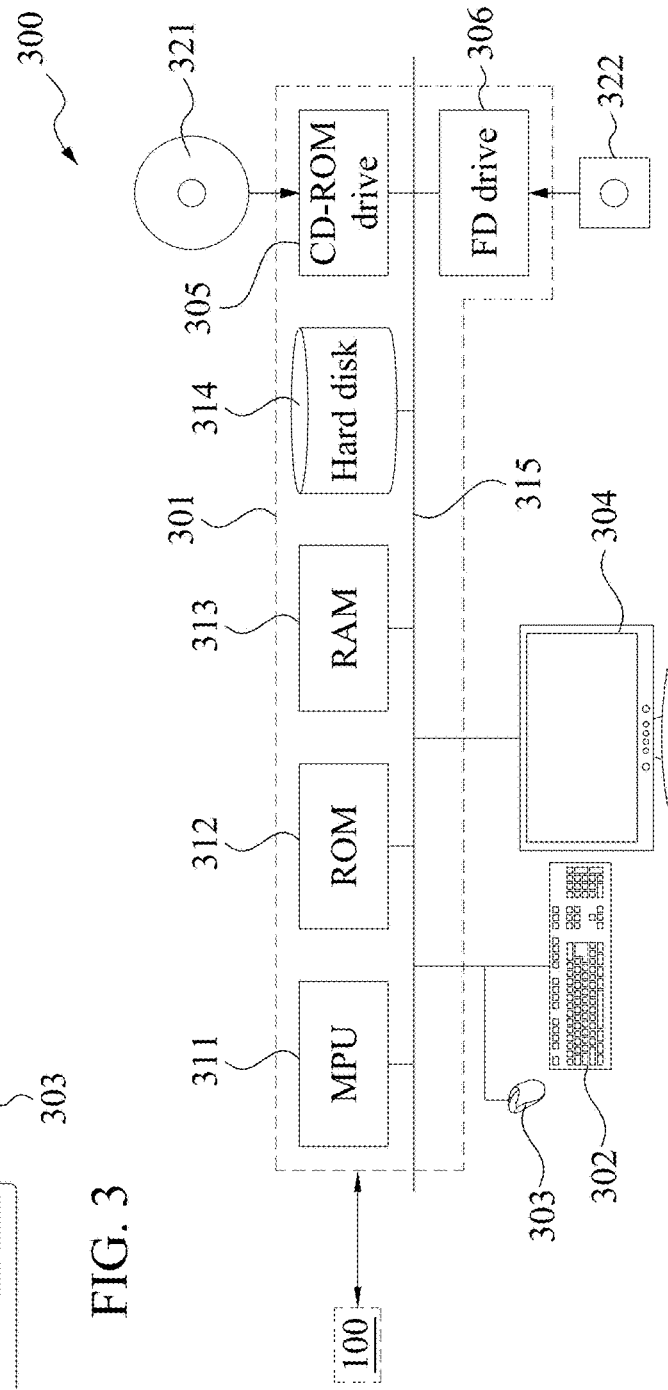

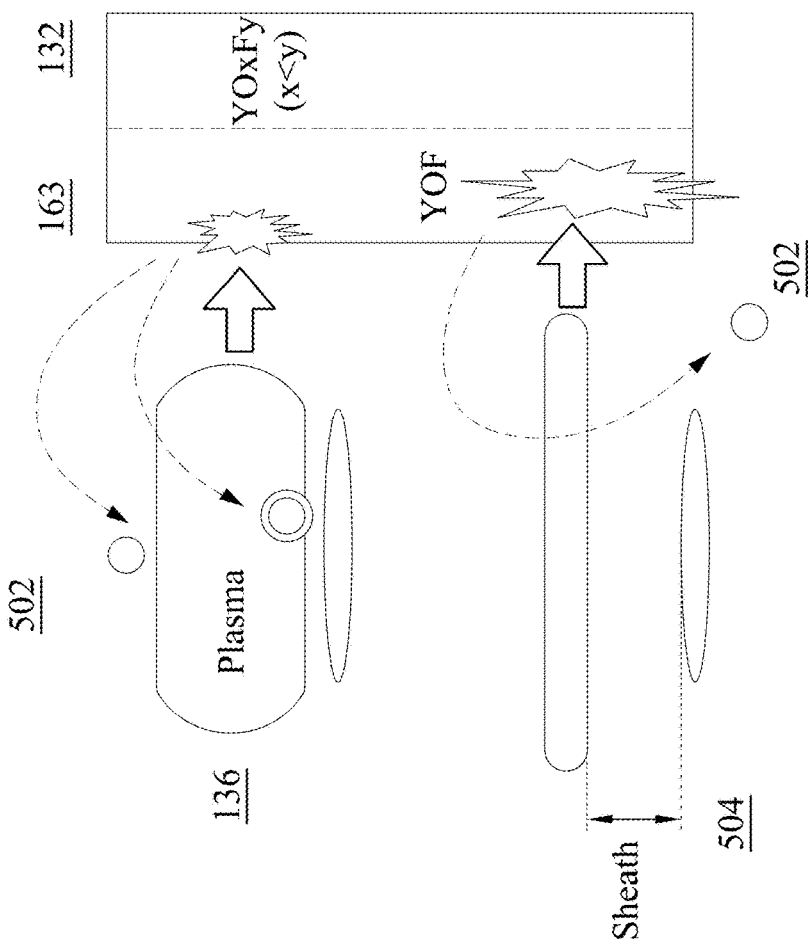
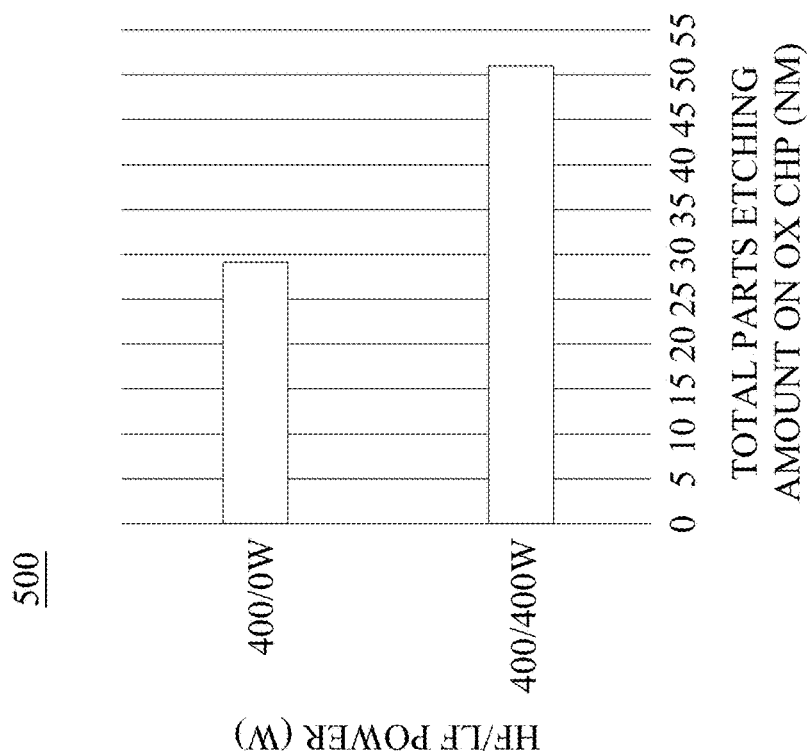
FIG. 5

METHOD AND APPARATUS FOR REVITALIZING PLASMA PROCESSING TOOLS

BACKGROUND

Aluminum-based parts are widely used in semiconductor manufacturing processes that employ plasma. Surface coatings of the aluminum-based parts are very critical in high-density plasma processes, such as plasma etching, because the plasma process includes highly reactive and corrosive gas. Very often, the plasma process is sensitive to changes in surface coatings of the aluminum-based and similar parts, including fine ceramic (FC) parts. Accordingly, maintaining a clean and stable surface coating is desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features have been arbitrarily increased or reduced for clarity of discussion.

FIG. 3 and FIG. 4 are diagrams of a controller in accordance with some embodiments.

FIG. 5 depicts plasma impact on a coating of plasma processing tools according to some embodiments.

DETAILED DESCRIPTION

Figure 1:
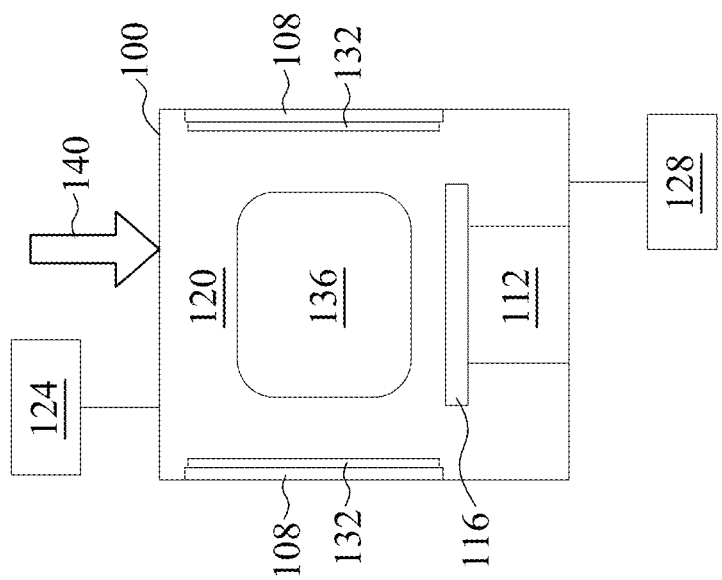
FIG. 1 shows a schematic view of a semiconductor wafer processing system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and also includes embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In plasma etching and/or deposition processes, contaminant particles reduce the yield of the processes by, for example, undesirably shielding portions of a mask pattern or contaminating a workpiece. In some plasma process apparatuses having a chamber made of aluminum, a surface coating is employed to prevent particles from being generated. Some surface coatings of the aluminum-based and FC parts, such as yttrium-based ceramics or coatings, make it possible to extend operational time, compared to others, such as anodized aluminum (Al) alone. Also, some surface coatings of the aluminum-based parts generate contaminant particles more easily than others. The surface change of the aluminum-based part's coatings over time adversely affects the radio frequency (RF) current return of wafer stages, as well as plasma characteristics including radical concentrations, plasma density and other parameters, which in turn detrimentally causes significant etch rate drift and the like. It is therefore desirable to maintain a clean and a stable surface in locations and routes where wafers and other tools pass through during the plasma process, such as tool grippers, chambers, substrate holders, and the like. In particular, the ability to produce high quality microelectronic devices and reduce yield losses is dependent upon maintaining the surfaces of critical components substantially defect-free. This would include maintaining the surfaces free of particulate matter, e.g., maintaining an ultra-clean surface, thereby ensuring that particulate matter is not deposited on the surface of the wafer, the reticle or mask, or other critical components. This is of particular concern as finer features are required on the microelectronic device. The types of particulate matter are any arbitrary combination depending on the environment and the vacuum condition of the plasma apparatus employed. The particulate matter is introduced from etching byproducts in the semiconductor manufacturing process, organic hydrocarbon contaminants, any kind of fall-on dust, outgassing from coatings, and the like.

Previously, plasma process equipment has been cleaned using a vacuum and an isopropyl alcohol/ethanol wipe-down after removal from the processing apparatus. In other instances, a wet clean process is employed. Particle counters are then used to monitor and verify cleanliness. However, such manual and wet cleaning operations are not preferable for certain delicate or small components. For purposes of cleaning a peeling weakness surface (PWS) layer that builds up on protective coatings of plasma processing tools, such as wafer holding tools as described herein, it has been discovered that manual and wet clean processes are simply not effective in removing the PWS layer. Plasma processing tools will then eventually contaminate the other semiconductor wafer processing apparatus over time during operational use. Thus, alternate methods of maintaining cleanliness of plasma-exposed components is required.

FIG. 1 is a schematic view of a semiconductor wafer processing system 100 in accordance with various embodiments. In some embodiments, the semiconductor wafer processing system 100 includes an etch system, such as a plasma etching system. The processing system 100 comprises, in various embodiments, a plasma processing chamber 120 for etching a substrate 116, and at least one chamber surface 108 including a surface coating 132 having an yttrium compound, such as $Y_xO_yF_z$ or $YF_3$. The substrate 116 is disposed on an electrostatic chuck (ESC) 112 inside the semiconductor wafer processing system 100. Coupled to the plasma processing chamber 120 are a radio frequency (RF) or microwave power source 124 and a low pressure vacuum system 128. The RF or microwave power generator 124 provides power to create a plasma 136 inside the plasma processing chamber 120. Direct current (DC) power is used in addition to or in place of the RF or microwave sources. Process gas 140 is introduced into the plasma processing chamber 120 to create the plasma 136. Process gases 140 include oxygen-containing gases such as $O_2$, CO, $CO_2$, $H_2O$ or $H_2O_2$. Process gases also include gasses such as $CF_4$, $C_4F_8$, $C_5F_8$, $F_2$, $SF_6$, HBr, $NH_3$, $NF_3$, $H_2$, HCl, $Cl_2$ and others in various embodiments.

It should be appreciated that while the processing system 100 is described herein as a plasma etching system, the embodiments of the disclosure should not be limited thereto. The processing apparatus 100 is configured to perform any manufacturing procedure on a semiconductor wafer, such as substrate 116. For example, the processing apparatus 100 is configured to perform manufacturing procedures that include deposition processes such as plasma-enhanced chemical vapor deposition (PECVD), sputtering, and/or other deposition processes. Alternately, processing system 100 includes a cleaning system, a developing system, a chemical treatment system, a thermal processing system, a coating system, a chemical vapor deposition (CVD) system, a physical vapor deposition (PVD) system, an ionized physical vapor deposition system (i-PVD), an atomic layer deposition (ALD) system, and/or combinations thereof. The disclosures herein are not limited to such devices and include, thermal process devices, cleaning apparatus, testing apparatus, or any other procedure involved in the processing of the semiconductor wafers, and/or any combination of such procedures.

Figure 2:
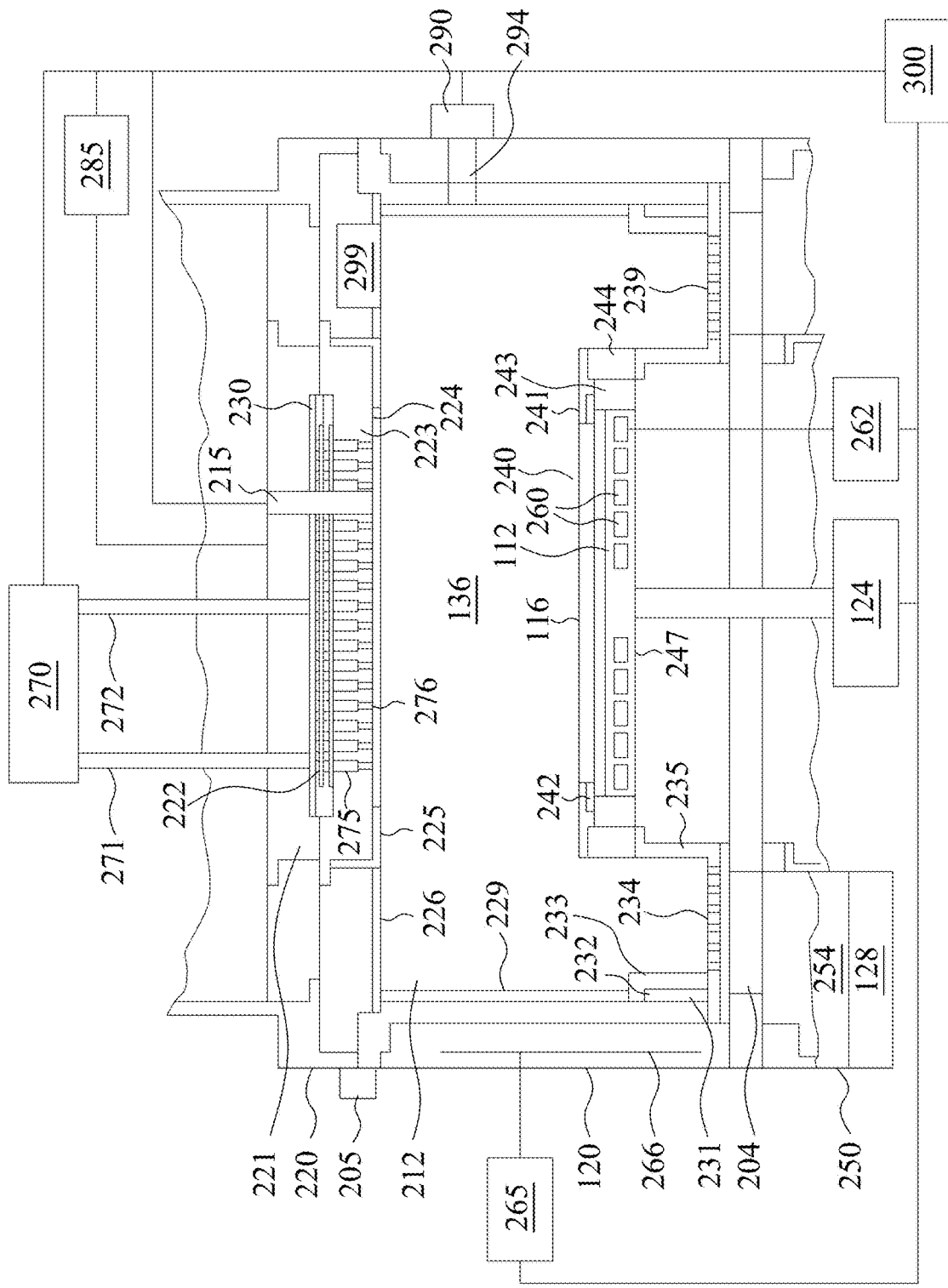
FIG. 2 is a diagram of a plasma chamber according to some embodiments.

Turning now to FIG. 2, therein is depicted exemplary internal components of a semiconductor wafer processing system 100, which will now be described in more detail. Processing system 100 includes elements for controlling the chamber wall temperature. As shown, a wall temperature control element 266 is coupled to a wall temperature control unit 265, and the wall temperature control element 266 is coupled to the processing chamber 120. The temperature control element includes a heater element, cooling element and/or temperature sensing element. For example, the heater element includes a resistance heater or a carbon heater element. The temperature of the processing chamber 120 is monitored using a temperature-sensing device such as a thermocouple. Furthermore, a chamber temperature controller (not shown) utilizes the temperature measurement as feedback to the wall temperature control unit 265 in order to control the temperature of the processing chamber 120. In additional embodiments, the substrate holder 240 includes temperature control elements 260 for controlling the temperature of the substrate 116. Control/power source 262 provides signals and/or energy to the control elements 260, and heat or cool the substrate holder 240 and the substrate 116. In addition, the processing system 100 further includes a pressure control system 250 coupled to the processing chamber 120 to control the pressure in the processing chamber 120. The pressure control system 250, in various embodiments, is a vacuum pump 128 with a gate valve 254 for controlling the chamber pressure, and a pressure sensor (not shown). For example, the vacuum pump 128 is capable of a pumping speed up to five thousand liters per minute. Vacuum pumps 128 are useful for low pressure processing, typically less than 50 mTorr. For high pressure (i.e., greater than 100 mTorr) or low throughput processing (i.e., no gas flow), a mechanical booster pump and dry roughing pump is used. Although the pressure control system 250 is shown coupled to the bottom of the processing chamber 120, this is not required. In alternate embodiments, a pressure control system 250 is coupled to the top, and/or side of the processing chamber 120. Furthermore, a controller 300 (described below with respect to FIG. 3) utilizes a pressure measurement as feedback to the pressure control system 250 in order to control the pressure of the plasma processing chamber 120. The processing chamber 120 facilitates the formation of processing plasma 136 in a process space adjacent to substrate 116. Alternately, the plasma processing chamber 120 facilitates the introduction of a process gas 140 in a process space adjacent to substrate 116. The processing system 100 is configured to process two or three hundred millimeter (mm) substrates, or larger substrates. In an alternate embodiment, processing system 100 includes multiple processing chambers 120, and the processing system 100 operates by generating plasma 136 in one or more processing chambers 120.

In various embodiments, the processing system 100 further includes an upper assembly 220 coupled to the processing chamber 120. For example, the upper assembly 220 includes a gas distribution plate 275 that is coupled to a gas distribution system 270 for introducing a process gas 140 into a process space within the processing chamber 120 in some embodiments. The gas distribution plate 275 further comprises a plurality of orifices 276 configured to distribute one or more gasses from the gas distribution system 270 to the process space of the processing chamber 120. The process gas 140 includes at least one of $NH_3$, HF, $H_2$, $O_2$, CO, $CO_2$, Ar, He, and $N_2$. For example, during a poly and/or nitride processes the process gas 140 is at least one of dichlorosilane (DCS), trichlorosilane (TCS), $SiH_4$, $Si_2H_6$, hexachlorodisilane (HCD), and $NH_3$ in some embodiments. During a CVD oxide process, the process gas 140 includes at least one of tetraethoxysilane (TEOS) and bistertiarybutylaminosilane (BTBAS). During an ALD process the process gas 140 includes at least one of $H_2O$, trimethylaluminum (TMA), hafnium tertbutoxide (HTB), NO, or $N_2O$. During a metal CVD process the process gas 140 includes at least one of tungsten carbonyl, rhenium carbonyl, and t-amylimidotris (dimethylamido)tantalum (V) (taimata) in some embodiments.

In various embodiments, the upper assembly 220 is configured to perform at least one of the following functions: provide a capacitively coupled plasma (CCP) source, provide an inductively coupled plasma (ICP) source, provide a transformer-coupled plasma (TCP) source, provide a microwave powered plasma source, provide an electron cyclotron resonance (ECR) plasma source, and provide a surface wave plasma source.

In various embodiments, the upper assembly 220 includes an upper electrode 230 and/or magnet system components (not shown). In some embodiments, the upper assembly 220 includes supply lines, injection devices, and/or other gas supply system components (not shown). Furthermore, the upper assembly 220 includes a housing, a cover, sealing devices, and/or other mechanical components (not shown).

As shown in FIG. 2, the processing system 100, in various embodiments, further includes an inner deposition shield 229, a shutter 231, an inner shutter 232, a bottom cover 233, an exhaust plate 234, and a lower wall cover 235. In various embodiments, the inner deposition shield 229, the shutter 231, the inner shutter 232, the bottom cover 233, the exhaust plate 234, the lower wall cover 235, and/or the substrate holder 240 include a protective barrier or surface coating 132 formed on one or more exposed surfaces to prolong life and prevent decay of the components due to plasma exposure.

In various embodiments, the processing chamber 120 includes a monitoring device 215 connected to a monitoring port (not shown), in order to permit optical or sensor monitoring of the plasma processing chamber 120 and used for end point detection, contamination detection and or other alerting of process operations.

In various embodiments, the substrate 116 is transferred into and out of the processing chamber 120 through an opening 294 that is controlled by a gate valve assembly 290. In addition, the substrate 116 is transferred on and off the substrate holder using a robotic substrate transfer system (not shown). In addition, the substrate 116 is received by substrate lift pins (not shown) housed within the substrate holder 240 and mechanically translated by devices housed therein. Once the substrate 116 is received from substrate transfer system, it is lowered to an upper surface of substrate holder 240.

In some embodiments, the substrate 116 is affixed to the substrate holder 240 via an electrostatic clamping system, but passive wafer restraints are also used. Moreover, the process gas 140 is delivered to the backside of the substrate 116 via a backside gas system (not shown) to improve the gas-gap thermal conductance between the substrate 116 and the substrate holder 240. Such a system is utilized when temperature control of the substrate 116 is required at elevated or reduced temperatures. In other embodiments, heating elements, such as resistive heating elements, or thermoelectric heaters/coolers are included.

In alternate embodiments, wafer holding tools such as a substrate holder 240, further include a vertical translation device (not shown) that is surrounded by a bellows (not shown) coupled to the substrate holder 240 and the processing chamber 120, which is configured to seal the vertical translation device from the reduced pressure atmosphere in the processing chamber 120. Additionally, a bellows shield (not shown) is coupled to the substrate holder 240 and configured to protect the bellows.

As shown in FIG. 2, the substrate holder 240, for example, further includes a focus ring 241, a focus ring base 242, an ESC enclosure 243, an insulator ring 244, an electrostatic chuck 112, and a lower electrode 247. The focus ring 241, the focus ring base 242, the ESC enclosure 243, and/or the insulator ring 244, in various embodiments, include a surface coating or protective barrier (not shown) formed on one or more exposed surfaces to prolong life and prevent decay of the components due to plasma. Alternatively, the substrate holder 240 is configured in any of a variety of known manners.

In various embodiments, the substrate holder 240 includes a lower electrode 247 through which RF power is coupled to the process gas 140 in the process space of the plasma processing chamber 120. For example, substrate holder 240 is electrically biased at an RF voltage via the transmission of RF power from, for example, a first RF or microwave source 124. In some cases, an RF bias is used to heat electrons to form and maintain the plasma 136. A frequency for the RF bias ranges from one megahertz (MHz) to one hundred MHz in some embodiments, for example, 13.56 MHz. In addition, in other embodiments, the substrate holder 240 includes a surface coating 132 (i.e., a protective barrier) formed on one or more exposed surfaces of the substrate holder 240.

Again referring to FIG. 2, some embodiments of the upper assembly 220 include an upper electrode body 221, a top baffle assembly 222, a temperature control plate 223, an electrode cover 224, an inner shield ring 225, and an outer shield ring 226. In various embodiments, the electrode cover 224, the inner shield ring 225, and the outer shield ring 226 include a surface coating or protective barrier (not shown) formed on one or more exposed surfaces. In alternate embodiments, a protective barrier (not shown) is formed on one or more interior surfaces of the upper assembly 220.

In various embodiments, the processing system 100 includes a second RF system 285 that is coupled to the upper electrode 221 and used to provide additional RF power to the process gas 140 in the process space of the plasma processing chamber 120. In various embodiments, the upper electrode 221 is electrically biased at an RF voltage via the transmission of RF power from the second RF system 285. In some cases, this RF signal is used to form and/or control plasma. The frequency for the second RF system 285 ranges from one MHz to one hundred MHz, for example, 60 MHz.

Protective barriers, when used to protect components in processing system 100, are created in a number of different ways. In one case, a protective barrier is created by anodizing a metal, and impregnating the anodized surface with a fluoropolymer, such as polytetrafluoroethylene (PTFE). For example, a protective barrier is formed by hard anodizing aluminum or hard anodizing an aluminum alloy and impregnating the hard-anodized surface with PTFE. In other cases, a protective barrier is created using at least one of $Al_2O_3$, yttria ($Y_2O_3$), $Sc_2O_3$, $Sc_2F_3$, $YF_3$, $La_2O_3$, $CeO_2$, $Eu_2O_3$, and $DyO_3$. In addition, a protective barrier is at least one of a Group III element (Group III of the periodic table) and a lanthanide element; the Group III element includes at least one of yttrium, scandium, and lanthanum in some embodiments. The lanthanide element includes at least one of cerium, dysprosium, and europium in some embodiments. In some embodiments, a protective barrier is formed in the processing chamber 120 as part of a pre-process coating, such as a silicon nitride or Si coating before forming the desired process film. In some embodiments, a sensor 299, such as an x-ray photoelectron spectrometer (XPS) is provided within the plasma processing chamber 120, or in operable proximity thereto, to monitor the level of contaminants on FC parts, plasma processing parts or tools or otherwise inside the chamber (i.e., airborne contaminants). The sensor 299 senses spectra corresponding to yttrium-based compounds or other pertinent contaminants that are generated by the plasma processing parts and tools over time due to plasma exposure.

As shown in FIG. 2, a processing module 100 includes an upper assembly 220 and a processing chamber 120 having a substantially cylindrical electrically conductive unit including an open top in various embodiments. The upper assembly 220 is detachably fixed to the processing chamber assembly 120 by a locking mechanism 205, and thus, the processing chamber assembly 120 is opened and/or closed freely. This facilitates the replacement or cleaning of components and/or the cleaning of the chamber.

A gas supply system 270 is coupled to the upper assembly 220. In some embodiments, a two-zone gas distribution configuration is used. A first gas supply line 271 is coupled to a first distribution zone (not shown), and a second gas supply line 272 is coupled to a second distribution zone (not shown). For example, the first distribution zone is located in a center portion of the chamber, and the second distribution zone is located in a peripheral portion of the chamber. A plurality of gas outlet holes 276 are formed in the upper assembly 220 to provide a process gas into a plasma processing space 212. The outlet holes (orifices) 276 are connected to the gas supply system 270 through the baffle 222. Thus, one or more different process gasses are supplied from the gas supply source 270 at different rates into different zones of the plasma processing space 212 via the outlet holes 276.

In various embodiments, an exhaust plate 234 is provided around the bottom portion of the substrate holder 220. The exhaust plate 234 is used to separate the plasma processing space 202 from an evacuation space 204, and the exhaust plate 234 includes a plurality of holes 239 formed in the exhaust plate 234. For example, the plurality of holes 239 include a plurality of through holes and a plurality of blind holes (non-through holes). The plasma processing space above the exhaust plate 234 and the evacuation space 204 below the exhaust plate 234 communicate with each other through the through holes 239. Thus, the process gas 140 inside the plasma processing chamber 120 travels through the through holes 239 in the exhaust plate 234 and is then evacuated as necessary by the pressure control system 250.

The system of FIG. 2 is used for etching, for example, a gate stack for a semiconductor device. Specifically, a gate stack originates from a multilayer structure including a layer of undoped polysilicon, a layer of doped polysilicon, and an antireflective coating layer. This multilayer structure is then masked and etched to provide a gate stack structure having desired critical dimensions, such as a vertical height critical dimension (CD). Other semiconductor devices are readily contemplated as well.

Over time, the repeated performance of etching processes leads to conditions within the processing chamber 120 that are undesirable for further performance of the etched process. For example, the etching process leads to particle buildup on chamber components, which break away to contaminate the substrate 116 being processed. Thus, periodic cleaning of the plasma processing chamber 120 must be performed.

FIG. 3 and FIG. 4 illustrate a computer system 300 for controlling the processing system 100 and its components in accordance with some embodiments of the present disclosure. FIG. 3 is a schematic view of a computer system 300 that controls the plasma processing system 100 of FIG. 1. In some embodiments, the computer system 300 is programmed to initiate a process for monitoring contamination levels of chamber components, wafer holding tools or airborne contamination arising from the same and provide an alert that cleaning is required. In some embodiments, manufacturing of semi-conductor devices is halted in response to such an alarm. In some embodiments, a clean in place (CIP) process is initiated in response to the activation of such an alarm. As shown in FIG. 3, the computer system 300 is provided with a computer 301 including an optical disk read only memory (e.g., CD-ROM or DVD-ROM) drive 305 and a magnetic disk drive 306, a keyboard 302, a mouse 303 (or other similar input device), and a monitor 304.

FIG. 4 is a diagram showing an internal configuration of the computer system 300. In FIG. 4, the computer 301 is provided with, in addition to the optical disk drive 305 and the magnetic disk drive 306, one or more processors 311, such as a micro-processor unit (MPU) or a central processing unit (CPU); a read-only memory (ROM) 312 in which a program such as a boot up program is stored; a random access memory (RAM) 313 that is connected to the processors 311 and in which a command of an application program is temporarily stored, and a temporary electronic storage area is provided; a hard disk 314 in which an application program, an operating system program, and data are stored; and a data communication bus 315 that connects the processors 311, the ROM 312, and the like. Note that the computer 301, in some embodiments, includes a network card (not shown) for providing a connection to a computer network such as a local area network (LAN), wide area network (WAN) or any other useful computer network for communicating data used by the computer system 300 and the plasma processing system 100.

The program for causing the computer system 300 to execute the process for controlling the plasma processing system 100 of FIG. 1, and components thereof and/or to execute the process for the method of manufacturing a semiconductor device according to the embodiments disclosed herein are stored in an optical disk 321 or a magnetic disk 322, which is inserted into the optical disk drive 305 or the magnetic disk drive 306, and transmitted to the hard disk 314. Alternatively, the program is transmitted via a network (not shown) to the computer system 300 and stored in the hard disk 314. At the time of execution, the program is loaded into the RAM 313. The program is loaded from the optical disk 321 or the magnetic disk 322, or directly from a network. The program includes, in various embodiments, a cleaning program for periodically cleaning chamber surfaces, wafer holding components and the like, which has protective coatings or barriers to protect from plasma exposure. In various embodiments, cleaning program is run after detection of yttrium or yttrium compounds that are generated as protective coatings or barriers decay over time. In various embodiments, the detection occurs during operation of the processing system 100. In various embodiments, the cleaning program is run during a maintenance period when the processing system 100 is not operating.

The stored programs do not necessarily have to include, for example, an operating system (OS) or a third party program to cause the computer 301 to execute the methods disclosed herein. The program only includes a command portion to call an appropriate function (module) in a controlled mode and obtain desired results in some embodiments. In various embodiments described herein, the controller 300 is in communication with the processing system 100 to control various functions thereof. In various embodiments, the controller 300 automatically directs when to start and/or stop a cleaning process, for example, when contaminants are detected within the processing system 100.

The controller 300 is coupled to the chamber 120, monitoring device 215, upper assembly 220, substrate holder 240, pressure control system 250, control source 262, temperature control unit 265, gas supply system (gas distribution system) 270, first RF or microwave source 124, second RF source 285, and gate valve 290. The controller 300 is configured to provide control data to those system components and receive process and/or status data from those system components. For example, the controller 300 includes a microprocessor, a memory (e.g., volatile or nonvolatile memory), and a digital I/O port capable of generating control voltages sufficient to communicate and activate inputs to the processing system 100, as well as monitor outputs from the processing system 100. Moreover, the controller 300 exchanges information with chamber 120, monitoring device 215, upper assembly 220, substrate holder 240, pressure control system 250, control source 262, temperature control unit 265, gas supply system 270, first RF source 124, second RF source 285, and gate valve 290 in some embodiments. In addition, in some embodiments, a program stored in the memory is utilized to control the aforementioned components of a processing system 100 according to a process recipe. Furthermore, the controller 300 is configured to analyze the process and/or status data, to compare the process and/or status data with target process and/or status data, and to use the comparison to change a process and/or control a system component. In addition, the controller 300 is configured to analyze the process and/or status data, to compare the process and/or status data with historical process and/or status data, and to use the comparison to predict, prevent, and/or declare a fault or alarm.

It has been found that with aluminum-based coatings used in semiconductor fabrication devices, yttrium particle accumulation occurs from aging parts and tools, especially after fifteen hundred RF-hours of plasma exposure time. Such particle accumulation has been discovered to arise from a fragile layer of yttrium-containing compounds that build up over time on a surface of the protective coating of such parts and tools. Such fragile layer, referred to herein as a peeling weakness surface (PWS), cannot be removed by prior cleaning processes, as described previously above. The components include, but are not limited to exhaust plates, bottom rings, deposition shields, shutters, deposition rings and the like. In various embodiments, the body of such components and chamber surfaces is made of aluminum. The surfaces of such aluminum-based components are protected by a protective or surface coating that includes $CO_2$ and yttrium based compounds, such as $Y_2O_3$ or $YF_3$. Initially, such a protective coating protects the components from decay without impacting the composition and distribution of plasma 136 within the plasma chamber 120. However, such coatings will age and generate contaminant particles during exposure to plasma after a period of operation.

The $Y_2O_3$ coating found in processing chambers themselves (i.e. chamber walls) is usually very stable to ambient conditions and has very high melting temperature, namely up to two hundred sixty-eight degrees Celsius. However, under $HBr/O_2$ high density plasma conditions, OH ions or hydrogen (H) and oxygen (O) atoms are generated. These species react with $Y_2O_3$ to form $Y(OH)_3$ as follows: $Y_2O_3 + 3H_2O = 2Y(OH)_3$. This yttrium hydroxide is very brittle and forms airborne contaminant particles from the $Y_2O_3$ coating surface. After plasma etching or other processes using a plasma 136, coated FC parts also age to form YOF, which in turn causes the formation of a PWS layer 163 that generates excessive yttrium element peeling and airborne contaminant particles 502 during plasma exposure, as now described below.

FIG. 5 depicts plasma impact on a surface coating 132 of plasma processing parts and tools (i.e., FC parts) over time according to various embodiments, where the surface coating is $YO_xF_y$. In the operation of some plasma chambers, mixed high-frequency (HF) and low-frequency (LF) power conditions are employed. As shown in graph 500, the etch amount on a substrate 116 increases with the addition of LF power. Namely, at four hundred watts (W) of HF and 0 W of LF (i.e., a first condition in which HF is used but LF is not), the etch amount is about thirty nanometers (nm). In this first condition, the surface damage is less than that of mixed RF conditions, however, a higher quantity of contaminant particles 502 may fall on the substrate. The contaminant particles 502 that drift from the PWS layer 163 generated over time on the surface coating 132 therefore causes contamination of the substrate 116 during wafer processing. At 400 W of HF and 400 W of LF (i.e., a second condition with mixed HF and LF usage), on the other hand, the etch amount is about fifty nm. Concomitantly, such a mixed power condition has higher parts damage that yields a low yttrium particle count. The plasma sheath 504 generated within the plasma processing chamber 120 protects from some drift of yttrium particle contaminants, but such contaminant particles 502 are not completely contained. Contaminant particles 502 do not fall on the substrate, as in the first condition, but instead are directed back to the PWS layer 163, creating more severe surface damage on the FC parts. Plasma etching using high power trim will thus deteriorate the surface coating 132 of FC parts after a sufficient period of high RF time. In aluminum tools with yttrium-based surface coatings exposed to the plasma 136, this causes an yttrium particle source defect. There are also full-spectrum defects in the yttrium-coated parts of the plasma etching chamber.

Figure 6:
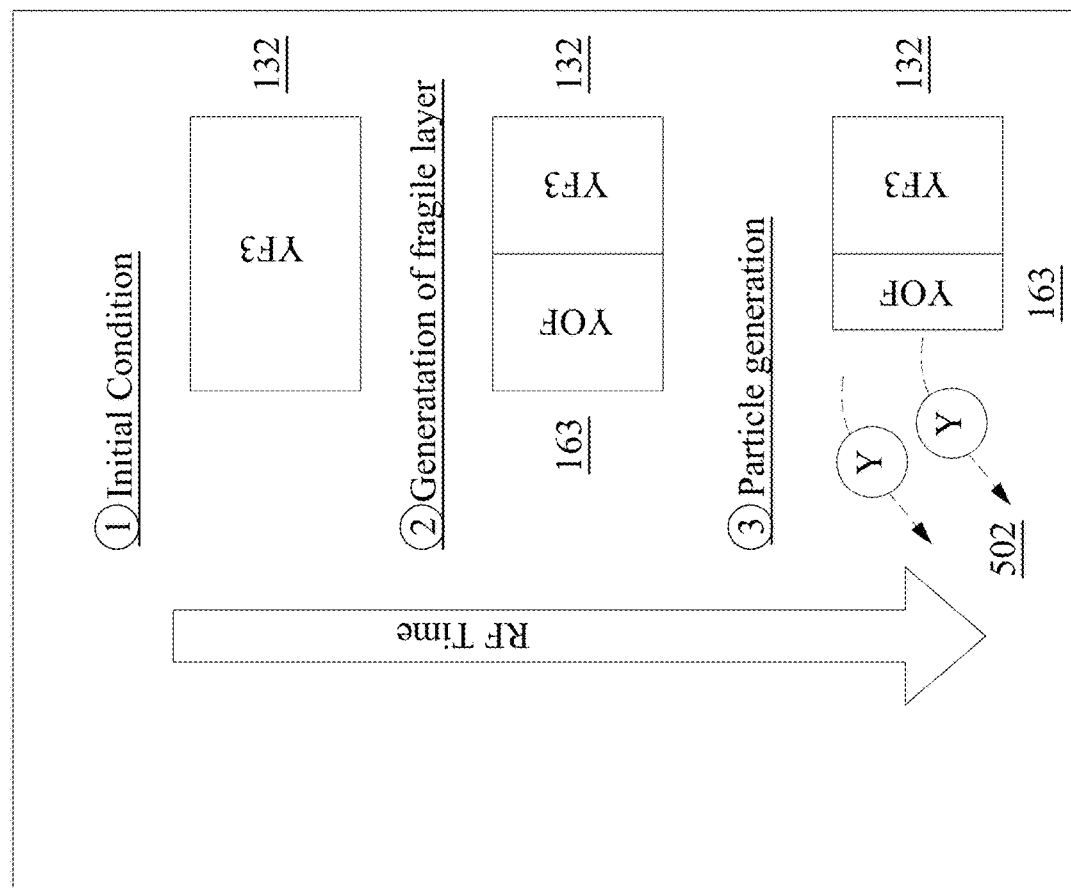
FIG. 6 depicts a peeling weakness surface (PWS) on a surface coating according to some embodiments.

Yttrium-based coatings, such as $Y_2O_3$ coatings, have been used in plasma process tools as a coating material due to its high resistance to erosion and corrosion, especially in metal or gate etch processes which involve $NF_3$, $Cl_2/O_2$ or $HBr/O_2$ plasmas. However, in some processes, particles originating from $Y_2O_3$ coatings are increasingly problematic, especially as the lines and structures of manufactured semiconductor devices become smaller and smaller. These particles cause device and process failure. $YF_3$ coating is used instead of $Y_2O_3$ in an attempt to suppress the generation of contaminant particles. However it has been found that the etch rate drifts or decreases significantly with fresh or cleaned parts, and extended dummy runs are required to season the parts in order to have an acceptable and stable etch rate. Contamination is also generated from an unexpected source. FIG. 6 schematically illustrates the progression of the development of a PWS layer 163 on a surface coating 132 comprising $YF_3$ according to some embodiments. When FC parts are new or newly used (i.e., initial condition), the $YF_3$ surface coating has no irregularities. It has been discovered that after being exposed to plasma over a period of time, the surface of the $YF_3$ coating slowly develops an irregular fragile PWS layer 163 of $YO_xF_y$ through processes that are presently not well understood. It has been observed that this PWS layer 163 grows over time. As aging progresses and plasma exposure continues, this PWS layer will generate contaminant particles 502 that can be peeled off from the surface and drift into the plasma chamber, thereby causing defects in workpieces. Wafer-less dry clean or wet clean processes are not sufficient to eliminate particle generation or to remove any portion of the PWS layer 163.

Figure 7:
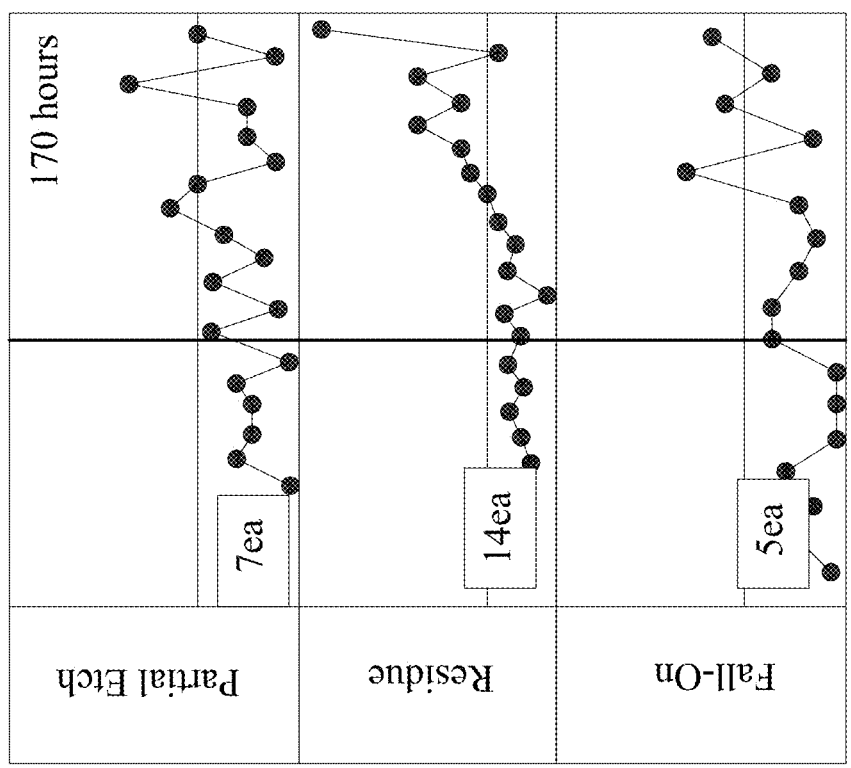
FIG. 7 depicts charts of contaminant concentration over time according to some embodiments.

Plasma etching with high power trim will consume parts after high RF time due, at least in part, to fall-on particle residue. This, in turn, adversely affects the defect level of workpieces. FIG. 7 depict charts 700 of three different defect levels of contaminant concentration over time under partial etch conditions, according to some embodiments. As shown in segment 710, an etch amount of seven nm is yielded after one hundred seventy hours of RF exposure. As shown in segment 720, this yields an etch amount of residue in the amount of fourteen nm. As shown in segment 730, this results in a fall on contamination level of five nm.

In some embodiments, the coated parts and Y-coated parts described herein refer to FC parts. Examination of Y-coated parts in the plasma processing chamber 120 by full spectra sensing found defects caused by Y particle accumulation, originating from the fragile PWS layer 163 of aging plasma processing parts after RF usage greater than fifteen hundred RF-hours. It has further been determined that such PWS layer 163 cannot be effectively removed by standard cleaning operations.

In order to reduce the defect issue and achieve superior performance by and extended lifetime of plasma processing parts, an optimized etch amount of approximately ten nm is performed by embodiments of the new cleaning processes for such parts and tools as disclosed herein. Examination by a particle monitor, such as an XPS that searches for the spectral wavelength of Y, shows that the weaker bonding energy of the PWS layer 163 on plasma processing part surfaces is overcome by the new cleaning methods disclosed herein, and the altered PWS layer 163 that yields Y contaminant particles is completely removed.

Figure 8:
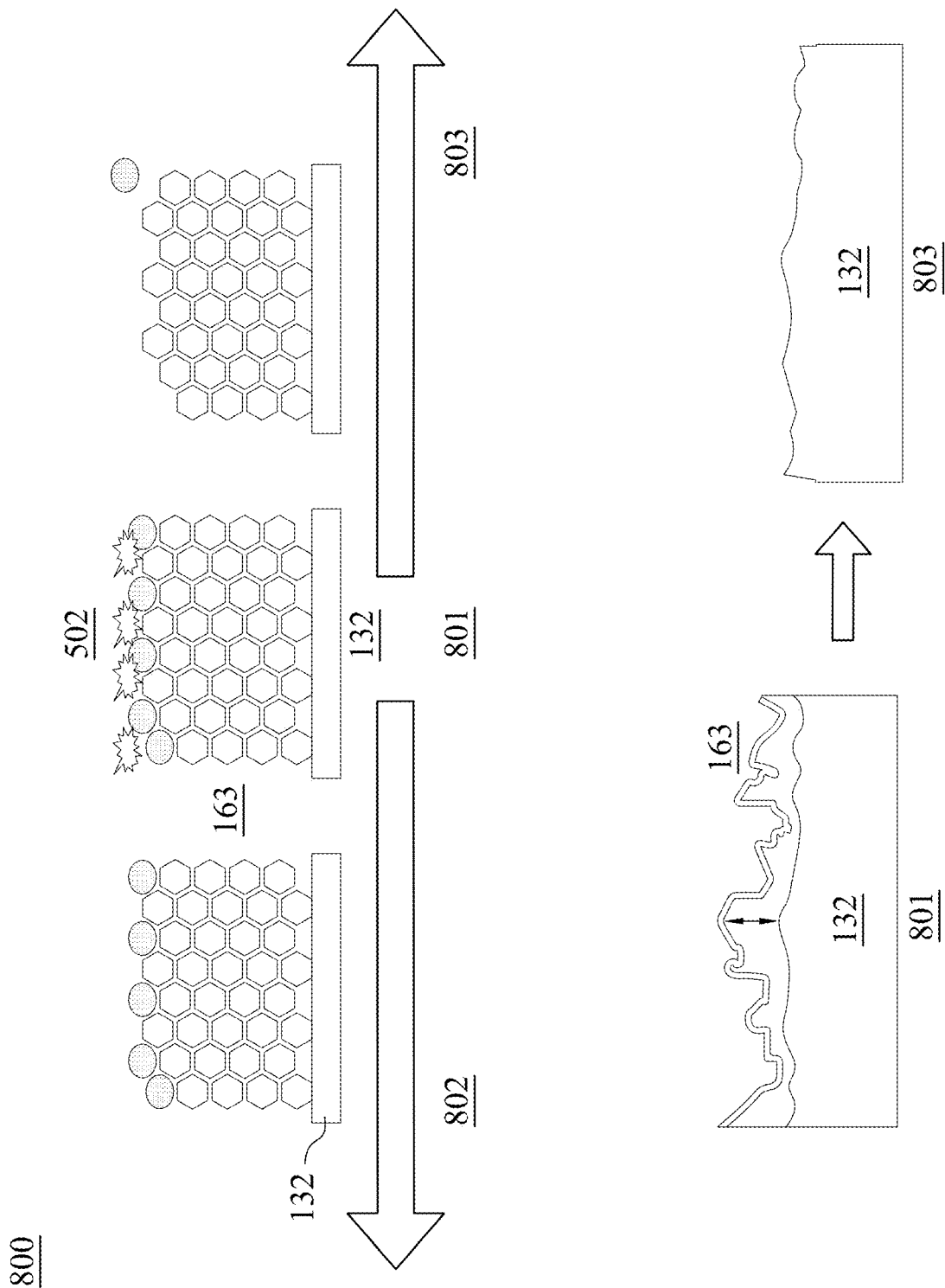
FIG. 8 illustrates the effects of a cleaning process according to some embodiments.

FIG. 8 illustrates the effects of the cleaning processes according to embodiments of the disclosure. A high-power fine-tuning process is used to modify the plasma etching depth on a substrate 116. In some embodiments, more than fifteen hundred watts RF is employed. The cleaning processes of the present disclosure is effective in removing the weaker-bonding energy PWS layer 163 on plasma processing parts and tools. In particular, instead of a water washing, the cleaning process uses sand blasting. The "surface treatment" method of sand punching and cutting objects, also referred to herein as a sand blasting or a bead beating method is a destructive processing method for removing an unwanted surface of the material. Fine abrasive sand particles or glass beads are used to impact the surface of the material, so that the surface produces a grain-like depression, thereby forming a matte surface or an eroded surface. Bead beating is used in embodiments of the disclosure as a new method to treat plasma processing parts in a manner not heretofore contemplated. In various embodiments, a bead beating apparatus includes a compressor (not shown) for supplying compressed air, a tank which contains an abrasive (not shown) to be used for the bead beating, a mixer that mixes the abrasive, as supplied from, for example, an external supply pipe (not shown) with the compressed air supplied from the compressor, and a nozzle (not shown) which sprays the abrasive from the mixer onto the surface of the material using the compressed air. In some embodiments, the compressed air includes a carrier fluid the carrier fluid, for example, CDA (clean dry air), nitrogen, argon, and other suitable fluids. In some embodiments, the abrasive includes glass beads, sand or other suitable particulates of appropriate size in the range of 1-5 nm. After a certain number of bead beating operations, or a certain amount of time, the abrasive is removed after use by a vacuum pump and filtered to remove impurities and contaminants and reused in a subsequent bead beating operation.

Diagram 800 of FIG. 8 displays the effects of the improved cleaning process on a protective coating or surface layer 132 on plasma processing components, parts and tools. Segment 801 shows a surface layer 132 with a PWS layer 163 that generates contaminant particles 502 after extended exposure to RF and plasma and before any cleaning process is applied. Segment 802 displays the effects of wet cleaning processes on the surface layer 132, in which the PWS layer 163 and contaminant particles 502 are partially mitigated but largely remain. Segment 803 displays the results of the bead beating process applied to the surface layer 132 in which the PWS layer 163 is largely removed and the generation of airborne contaminants is minimized.

Figure 9:
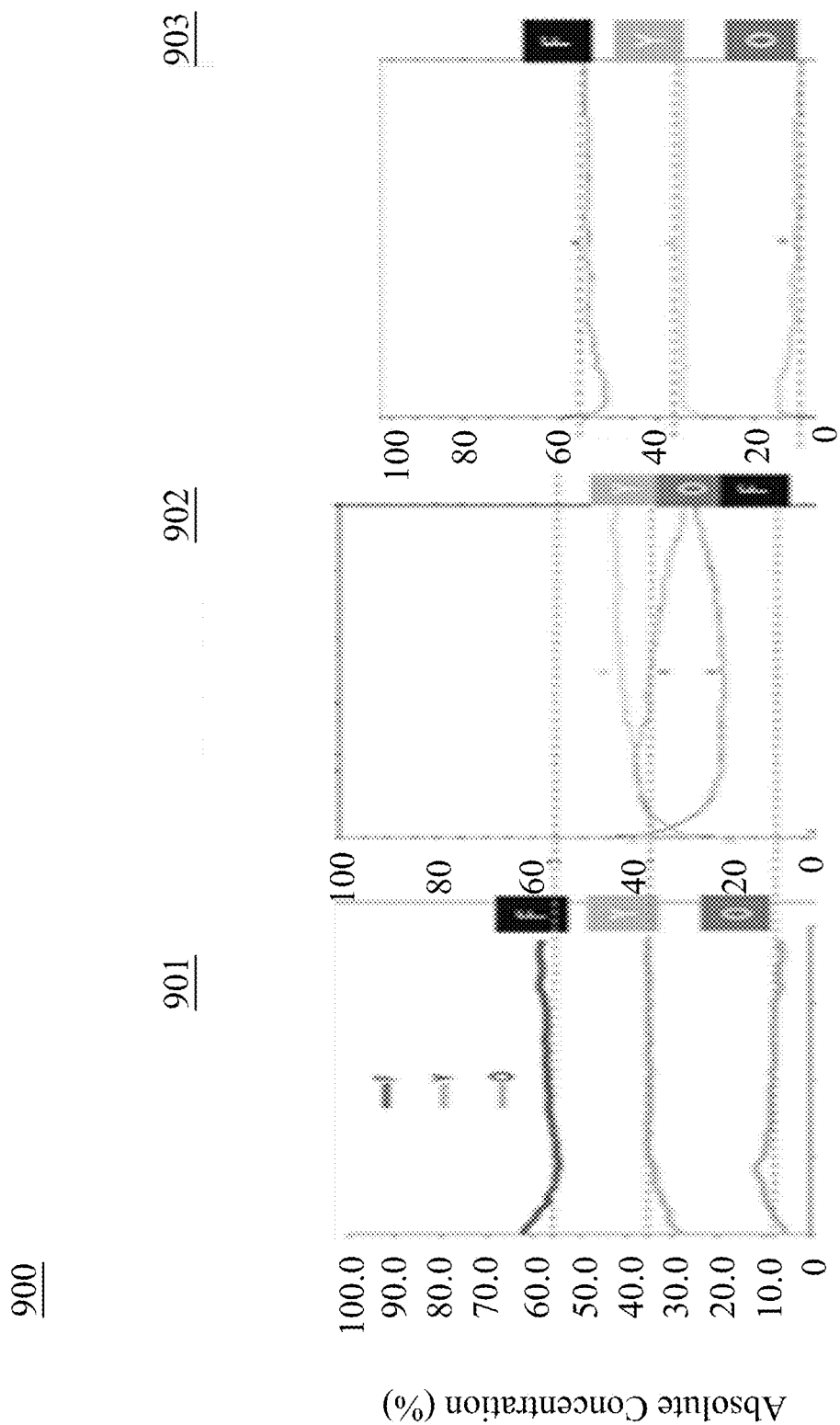
FIG. 9 illustrates the difference between a wet clean process and a bead beating clean process according to some embodiments.

Chart 900 of FIG. 9 further illustrates the difference in efficacy between a wet clean process and a bead beating process according to some embodiments. Segment 901 displays an initial condition of a protective barrier, such as surface layer 132, where the top line represents an amount of fluorine (F), the middle line represent the amount of yttrium and the bottom line represents an amount of oxygen (O) present. Segment 902 shows the composition of the same surface layer 132 after 2600 hours of RF and plasma exposure followed by a wet clean process, in which elevated amounts of Y and F are observed to remain. Segment 903 shows the results of a beat beating clean process on the surface layer 132 also performed after 2600 hours of RF and plasma exposure, in which the levels of F, Y and O have been comparatively restored to their initial conditions and stabilized due to the PWS layer 163 being largely removed.

Figure 10:
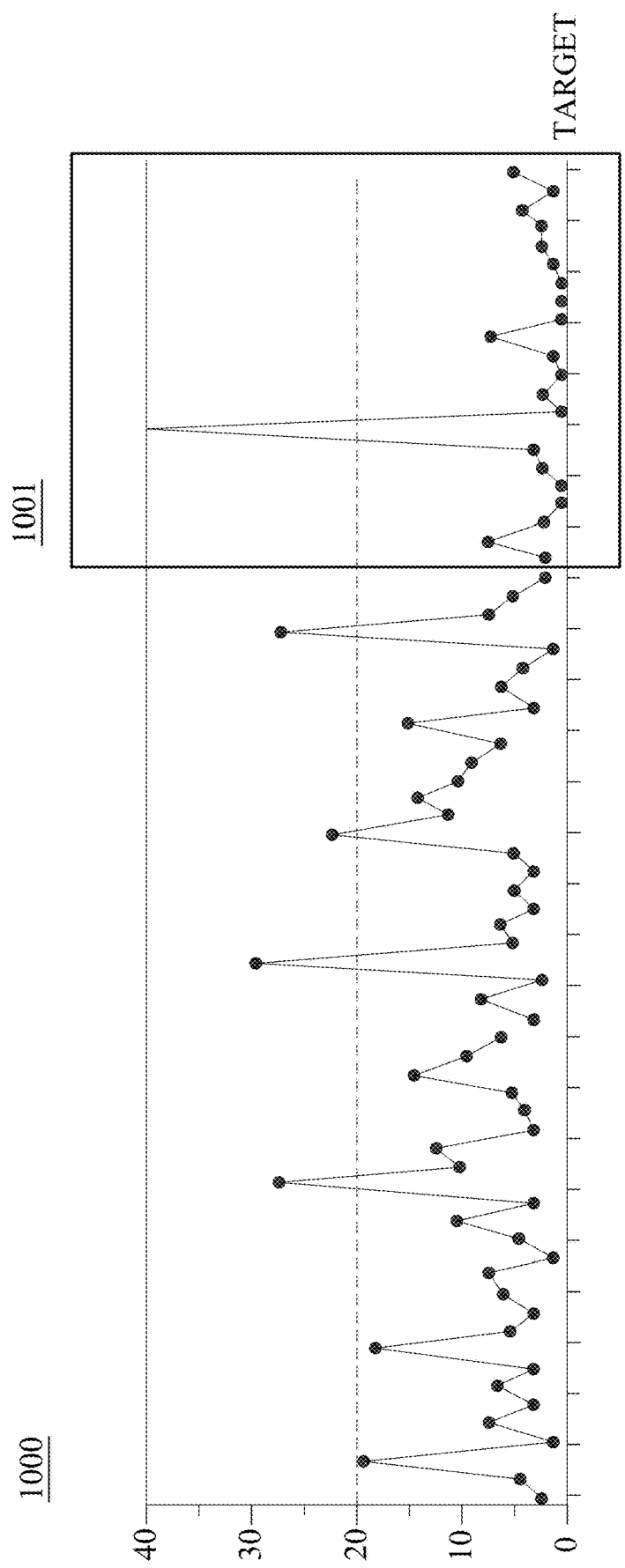
FIG. 10 is a chart illustrating the PWS before and after cleaning according to some embodiments.

FIG. 10 is a chart illustrating the condition of the PWS layer 163 over time and after cleaning according to some embodiments. As shown in segment 1001, which represents the characteristics of the surface layer 132 after bead beating is applied, in-line defects improve 36%-50% below the average (shown by the dotted line) and the peek highs observed in previous cycles are eliminated.

Figure 11:
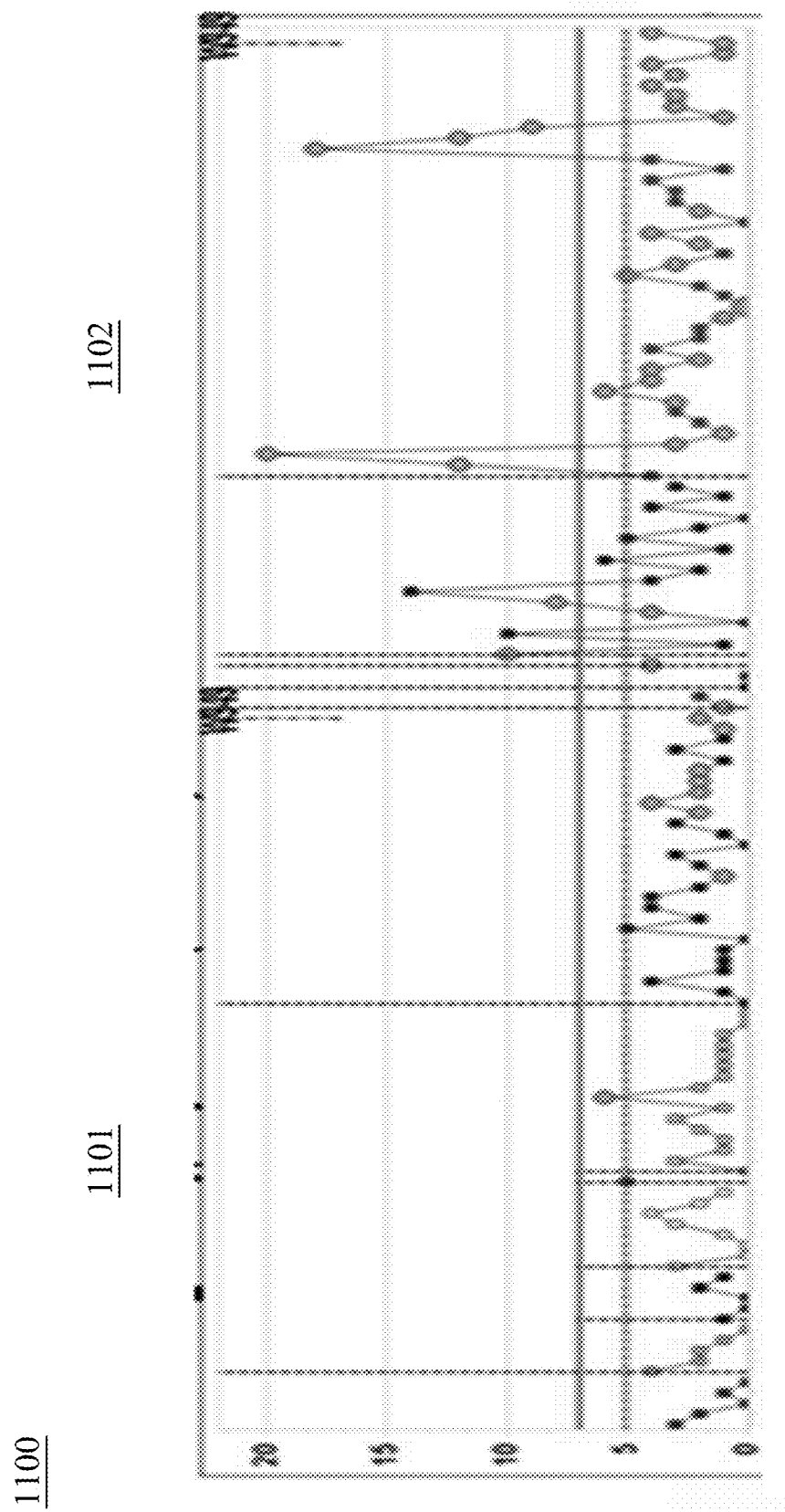
FIG. 11 is a second chart illustrating the PWS after cleaning and continued use according to some embodiments.

FIG. 11 shows a second chart 1100 illustrating the characteristics of the PWS layer 163 after cleaning and then after additional exposure to RF and plasma during wafer manufacturing operations, according to various embodiments. As demonstrated above, the bead beating cleaning processes restore the surface layer 132 to the initial operating conditions (as illustrated by segment 1101), but over time, the depth and roughness of the surface layer 132 increases again with increased RF and plasma exposure (as illustrated in segment 1102). This will lead to more airborne contaminant particles over time and the bead beating cleaning process will need to be applied again.

Figure 12:
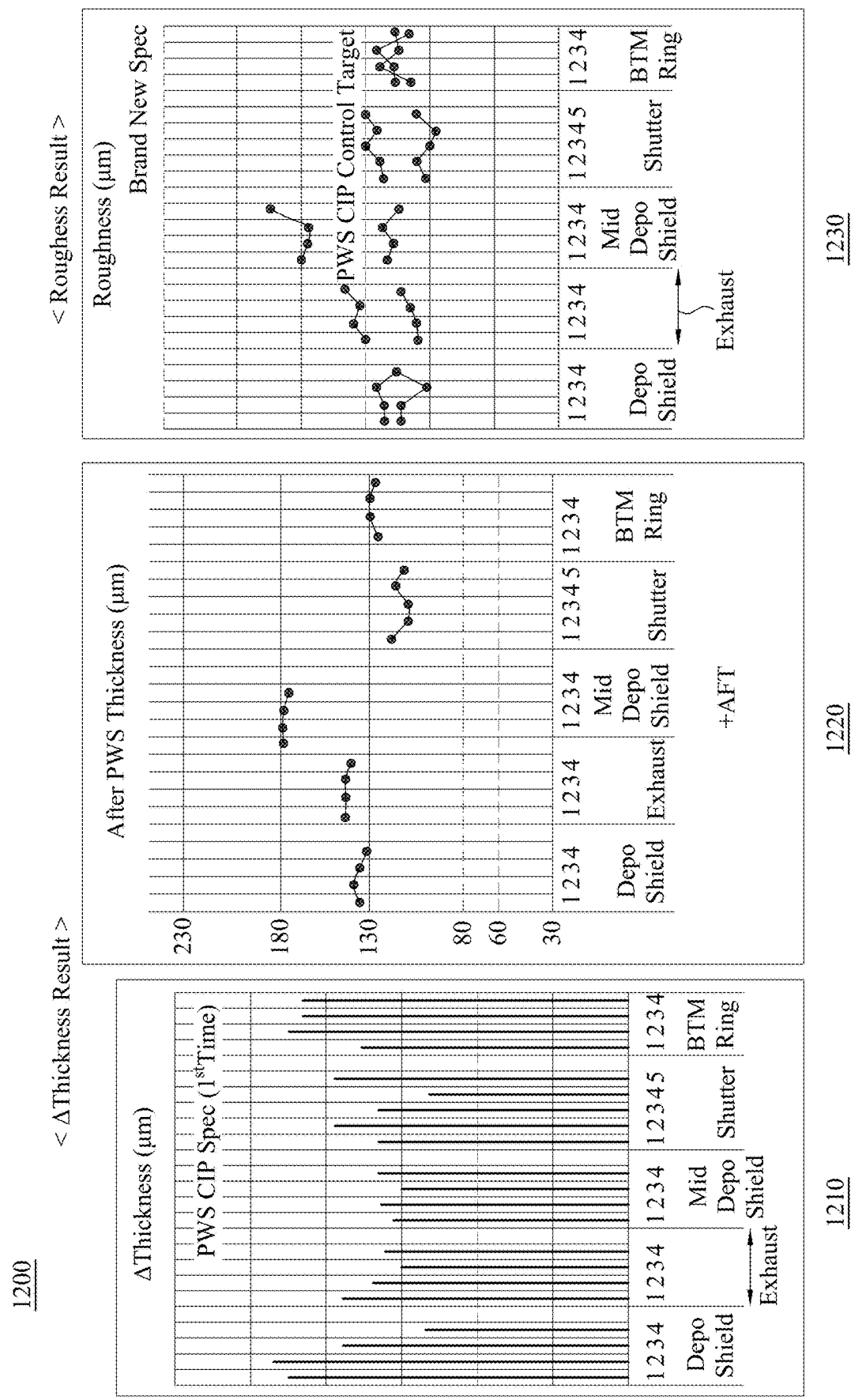
FIG. 12 depicts charts of coating thickness and roughness according to some embodiments.

FIG. 12 depicts a chart 1200 of coating thickness and roughness after the bead beating cleaning processes are applied, according to various embodiments. Segment 1210 shows the initial thickness (in micrometers) of a typical PWS layer 163 after plasma exposure, where the thickness control limit is 110 μm. Segment 1220 shows roughness data the peeling weakness surface. Each application of the bead beating process removes about 10 micrometers (um) of the PWS surface layer 132. In some embodiments, the thickness control limit of the surface layer 132 is between 110 μm and 150 μm. In some embodiments, the bead beating process is safely employed up to three times during the lifecycle of the part to revitalize the protective surface layer 132 without eliminating too much of its depth. After one cleaning, the data on the surface of the object was measured by x-ray photoelectron spectroscopy (XPS). Segment 1220 shows the thickness result from one such cleaning and demonstrates that the coating depth remains within specifications. Segment 1230 shows that roughness of the surface layer caused by buildup of the PWS layer 163 over time is likewise returned to specification.

Figure 13:
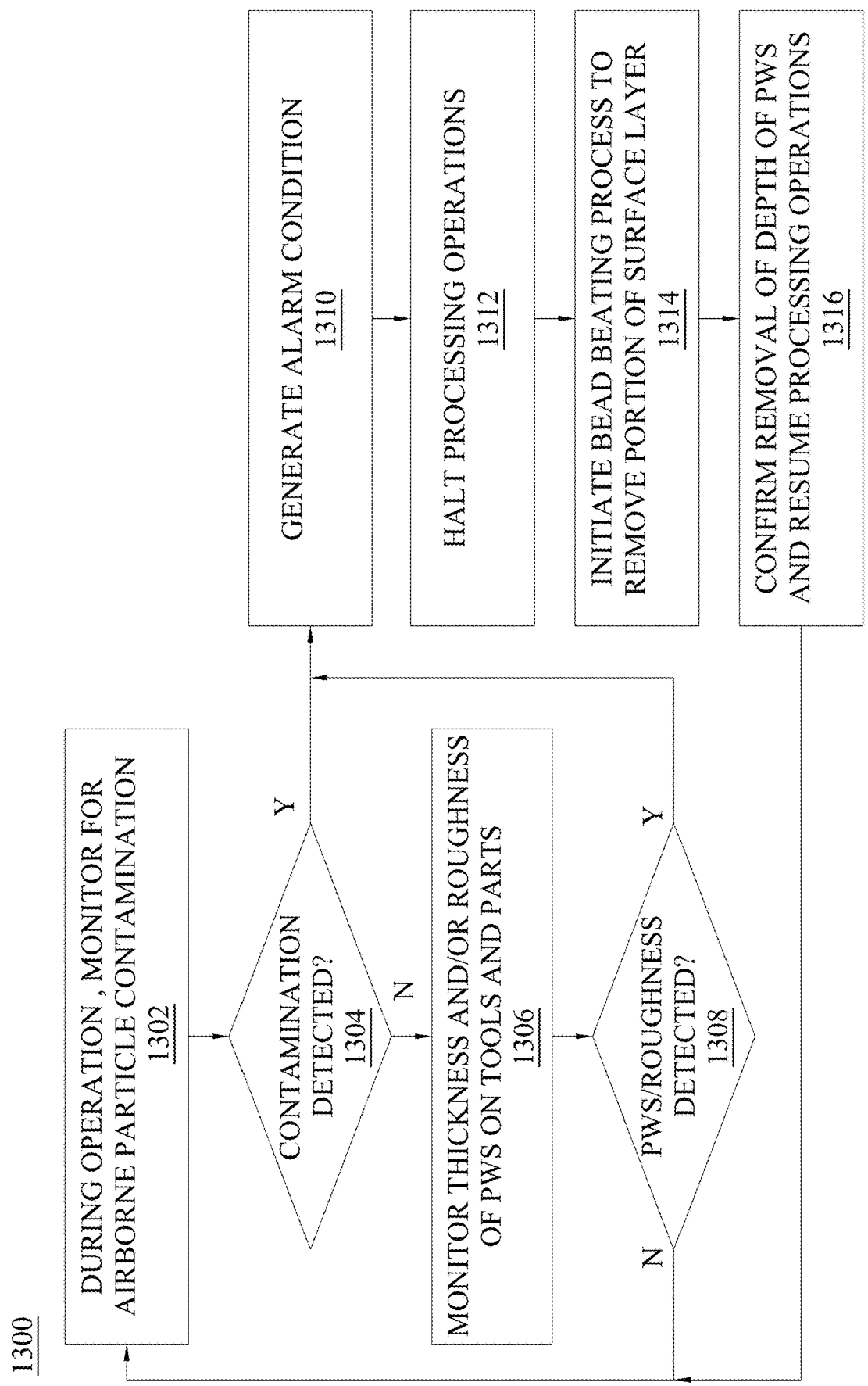
FIG. 13 is a flowchart of a process for detecting a PWS condition and initiating a cleaning process in accordance with some embodiments.

FIG. 13 is a flowchart of a process 1300 for detecting a PWS condition and initiating a cleaning and revitalizing process in accordance with the embodiments disclosed herein. At operation 1302, during a wafer manufacturing process, a sensor, such as sensor 299 monitors the plasma processing chamber for airborne particle contamination. In some embodiments, this operation is performed when the processing system 100 is offline in addition to or instead of being performed during the processing system operation.

At operation 1304, the controller 300 determines whether sufficient contamination levels are present based on the readings of sensor 299 to require cleaning contamination. In various embodiments, any detectable amount of airborne yttrium contamination particles 502 justifies cleaning. If particle contamination remains below a threshold value, the process 1300 continues to operation 1306. If contamination levels at or above the threshold value are instead detected, the process 1300 continues to operation 1310.

At operation 1306, the sensor 299 is used to monitor the thickness and/or roughness of the PWS layer 163 on any plasma processing parts, tools or components within the processing chamber 120. At operation 1308, the controller 300, based on the measurements from the sensor 299, determines whether a threshold amount of thickness or roughness is present on the plasma processing parts, tools and components to justify an alarm condition. In various embodiments, the thickness threshold is 10 um.

At operation 1310, the controller 300 generates an alarm condition in response to threshold levels of contamination present within the plasma processing chamber 120. In response to the alarm condition, when the processing system is online, the wafer manufacturing process is halted at operation 1312.

Next, at operation 1314, a bead beating cleaning process is initiated to remove the PWS layer 163 from the surface layer 132 on plasma processing parts, tools and components. In some embodiments, the bead beating cleaning process is performed as a clean-in-place (CIP) process where the parts, tools or components are left in place in the processing system 100 while the cleaning process is performed. In such embodiments, after the cleaning process is performed, vacuum pumps and the like are used to remove any loose residue generated by the cleaning process form the plasma processing chamber 120 before it is placed back into operation. In other embodiments, the plasma processing parts, tools and components are removed from the processing system 100 for cleaning and then re-placed back in the plasma processing chamber 120 before operation is re-commenced.

Then, at operation 1316, the sensor 299 is used to confirm removal of sufficient depth of the PWS layer 163, and that the thickness and/or roughness of the surface layer 132 is within specifications. If so, the process returns to operation 1302 above and semiconductor processing operations are resumed by the processing system 100. In various embodiments, the sensor 299 performs its operation during processing, during bead blast cleaning, after cleaning, during an offline time of the processing system 100, and inside or outside of the plasma processing chamber 120.

Benefits of the present disclosure include the removal of a PWS layer from tools and components that were not affected by wet clean methods. In various embodiments, the PWS layer is completely removed with each application. At the same time, the protective surface coatings of the tools and components are preserved. This in turn allows the tools and components to be used for extended lifetime when compared to the same tools and components not so cleaned. The cleaning of the PWS layer 163 in the embodiments described herein further prevent contamination of wafer processing equipment and workpieces, which, in turn, increases production yields and reduces the downtime of such equipment.

According to various embodiments hereinabove, a method for cleaning components of a plasma processing apparatus includes: (1) disposing a wafer holding tool having a surface coating 132 within a chamber 120 of the plasma processing apparatus 100; (2) initiating a wafer manufacturing process; (3) detecting, by a sensor 299, a presence of an airborne contaminant within the chamber, the airborne contaminant originating from a peeling weakness surface (PWS) 163 on the surface coating 132; (4) halting the wafer manufacturing process; and (5) initiating a revitalizing process that removes a depth of the PWS 163 from the surface coating 132.

In some embodiments, a thickness of the PWS 163 is measured after initiating the revitalizing process and when the thickness is within an acceptable range, the revitalizing process ends and the wafer manufacturing process is resumed. In some embodiments, a roughness of the PWS 163 is measured after initiating the revitalizing process and when the roughness is within an acceptable range, the revitalizing process ends and the wafer manufacturing process resumes. In some embodiments, the sensor 299 is activated after a threshold number of hours of operation of the plasma processing apparatus 100. In some embodiments, the sensor 299 comprises an x-ray photoelectron spectroscopy sensor. In some embodiments, the plasma processing apparatus 100 is a plasma etching apparatus and the chamber is a plasma chamber. In some embodiments, the plasma processing apparatus 100 is a plasma deposition apparatus having a plasma generation stage including the chamber 120. In some embodiments, the PWS 163 is yttrium hydroxide. In some embodiments, the airborne contaminant comprises yttrium. In some embodiments, a depth of the PWS 163 removed is at least 10 micrometers. In some embodiments, the cleaning process is a bead beating process or a sandblasting process.

In various embodiments, a method for prolonging the life of plasma processing tools, parts and components includes: (1) disposing a wafer holding tool within a chamber 120 of a plasma processing apparatus 100; (2) initiating a wafer manufacturing process; and (3) disposing a sensor 299 within the chamber 120 for measuring a thickness of a peeling weakness surface 163 on a coating 132 of the wafer holding tool. When the thickness exceeds a threshold value the wafer manufacturing process is halted and a revitalizing process for removing at least a portion of the peeling weakness surface 163 from the coating 132 is initiated.

In some embodiments, at least one of a depth and a roughness of the peeling weakness surface 163 is measured and when the at least one of the depth and the roughness is within an acceptable range the revitalizing process ends and the wafer manufacturing process commences. In some embodiments, at most ten micrometers of a thickness of the peeling weakness surface is removed from the coating. In some embodiments, the wafer manufacturing process is at least one of a plasma deposition process and a plasma etching process. In some embodiments, the revitalizing process is a bead blasting process.

In various embodiments, a plasma processing method includes measuring at least one of: (i) a thickness of a peeling weakness layer 163 on a surface coating 132 of the wafer holding tool, and (ii) a level of airborne contaminant within the chamber 120. A revitalization process to remove substantially all of the peeling weakness layer 163 from the surface coating 132 using bead beating is initiated when at least one of: (i) the thickness of the depleted layer exceeds a threshold thickness value, and (ii) an airborne contaminant originating from the PWS layer 163 is detected.

In some embodiments, the revitalization process is a CIP process. In some embodiments, the wafer holding tool is at least one of a bottom ring, an exhaust plate, a deposition shield, a shutter and a deposition ring. In some embodiments, the wafer holding tool is aluminum and the surface coating 132 is at least one of $Y_2O_3$ and $YF_3$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor wafer, comprising:
   disposing a wafer holding tool having a surface coating within a chamber of a plasma processing apparatus;
   initiating a semiconductor wafer manufacturing process;
   detecting, by a sensor, a presence of an airborne contaminant within the chamber, the airborne contaminant originating from a peeling weakness surface (PWS) on the surface coating;
   halting the semiconductor wafer manufacturing process; and
   initiating a revitalizing process that removes a depth of the PWS from the surface coating.

2. The method of claim 1, further comprising:
   measuring a thickness of the PWS after initiating the revitalizing process; and
   when the thickness is within an acceptable range:
      ending the revitalizing process; and
      resuming the semiconductor wafer manufacturing process.

3. The method of claim 1, further comprising:
   measuring a roughness of the PWS after initiating the revitalizing process; and
   when the roughness is within an acceptable range:
      ending the revitalizing process; and
      resuming the semiconductor wafer manufacturing process.

4. The method of claim 1, wherein the sensor is activated after a threshold number of hours of operation of the plasma processing apparatus.

5. The method of claim 1, wherein the plasma processing apparatus comprises a plasma etching apparatus and the chamber comprises a plasma chamber.

6. The method of claim 1, wherein the plasma processing apparatus comprises a plasma deposition apparatus having a plasma generation stage housed within the chamber.

7. The method of claim 1, wherein the sensor comprises an x-ray photoelectron spectroscopy (XPS) sensor.

8. The method of claim 1, wherein the PWS contains yttrium hydroxide (YOH).

9. The method of claim 1, wherein the airborne contaminant comprises yttrium (Y).

10. The method of claim 1, wherein the depth of the PWS removed is at least 10 micrometers.

11. The method of claim 1, wherein the revitalizing process is a bead beating process.

12. A method of manufacturing a semiconductor wafer, comprising:
    disposing a wafer holding tool within a chamber of a plasma processing apparatus;
    initiating a semiconductor wafer manufacturing process;
    measuring a thickness of a peeling weakness surface on a coating of the wafer holding tool using a sensor disposed in the chamber;
    when the thickness exceeds a threshold value:
       halting the semiconductor wafer manufacturing process; and
       initiating a revitalizing process for removing at least a portion of the peeling weakness surface from the coating.

13. The method of claim 12, further comprising:
    measuring at least one of a depth and a roughness of the peeling weakness surface; and
    when the at least one of the depth and the roughness is within an acceptable range:
       ending the revitalizing process; and
       resuming the semiconductor wafer manufacturing process.

14. The method of claim 12, wherein at most 10 micrometers of the thickness of the peeling weakness surface is removed from the coating.

15. The method of claim 12, wherein the semiconductor wafer manufacturing process comprises at least one of a plasma deposition process and a plasma etching process.

16. The method of claim 15, wherein the revitalizing process comprises a bead blasting process.

17. A method, comprising:
    measuring at least one of:
       a thickness of a peeling weakness layer on a surface coating of a semiconductor wafer holding tool disposed in a plasma processing chamber, and
       a level of airborne contaminant within the plasma processing chamber; and
    initiating a revitalization process that removes the peeling weakness layer from the surface coating using bead beating when at least one of:
       the thickness of the peeling weakness layer exceeds a threshold thickness value, and
       the level of the airborne contaminant is greater than a threshold limit is detected.

18. The method of claim 17, wherein the revitalization process is a clean-in-place (CIP) process.

19. The method of claim 17, wherein the semiconductor wafer holding tool comprises at least one of a bottom ring, an exhaust plate, a deposition shield, a shutter and a deposition ring.

20. The method of claim 17, wherein the semiconductor wafer holding tool comprises aluminum and the surface coating comprises at least one of $Y_2O_3$ and $YF_3$.

* * * * *